US010816507B2

United States Patent
Liu et al.

(10) Patent No.: US 10,816,507 B2
(45) Date of Patent: Oct. 27, 2020

(54) APPARATUS AND METHOD AND SYSTEM FOR INSPECTING A COMPONENT OF A GAS TURBINE ENGINE

(71) Applicant: United Technologies Corporation, Farmington, CT (US)

(72) Inventors: Xuan Liu, Glastonbury, CT (US); Zhong Ouyang, Glastonbury, CT (US); Andrew DeBiccari, North Branford, CT (US); William J. Brindley, Hebron, CT (US); Kathryn Macauley, Glastonbury, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 49 days.

(21) Appl. No.: 16/359,550

(22) Filed: Mar. 20, 2019

(65) Prior Publication Data
US 2020/0300810 A1   Sep. 24, 2020

(51) Int. Cl.
*G01N 27/72*   (2006.01)
*G01M 15/14*   (2006.01)
*G01R 33/12*   (2006.01)

(52) U.S. Cl.
CPC ............ *G01N 27/72* (2013.01); *G01M 15/14* (2013.01); *G01R 33/1223* (2013.01)

(58) Field of Classification Search
CPC .. G01R 33/032; G01R 33/0094; G01R 15/24; G01R 19/00
USPC .............................. 324/244.1, 200, 244, 228
See application file for complete search history.

(56) References Cited

U.S. PATENT DOCUMENTS

| | | | |
|---|---|---|---|
| 5,043,662 A | 8/1991 | Hudson et al. | |
| 5,597,762 A * | 1/1997 | Popovici | H01J 9/022 438/105 |
| 6,468,033 B1 | 10/2002 | Weidlich | |
| 8,378,676 B2 | 2/2013 | Ceschini et al. | |
| 8,574,536 B2 * | 11/2013 | Boudou | C09K 11/65 423/446 |

(Continued)

FOREIGN PATENT DOCUMENTS

| | | |
|---|---|---|
| DE | 102012100517 A1 | 7/2012 |
| EP | 1429078 A1 | 6/2004 |

(Continued)

OTHER PUBLICATIONS

European Search Report; Application No. 20164042.2-1004; dated Jun. 25, 2020; 5 pages.

*Primary Examiner* — Giovanni Astacio-Oquendo
(74) *Attorney, Agent, or Firm* — Cantor Colburn LLP

(57) ABSTRACT

Disclosed is an apparatus and method for inspecting a component of a gas turbine engine, which includes a sleeve configured to surround a component of a gas turbine engine, the sleeve including: a pair of opposing wall members being secured to each other at at least one of a pair of opposite ends; an internal cavity located between the pair of opposing wall members, wherein the internal cavity extends from one end of the sleeve to an opposite end of the sleeve; and a plurality of orifices extending through the pair of opposing wall members, and wherein a probe is inserted in each orifice in one of the pair of opposing wall members to determine the state of the internal cavities of a gas turbine component and determine the structural integrity of the component.

20 Claims, 3 Drawing Sheets

(56) References Cited

U.S. PATENT DOCUMENTS

2012/0186260 A1 7/2012 DiCintio et al.
2016/0097702 A1* 4/2016 Zhao .................. E21B 10/56
　　　　　　　　　　　　　　　　　　　73/799

FOREIGN PATENT DOCUMENTS

EP　　　3171086 A1　11/2016
EP　　　3220182 A1　　9/2017

* cited by examiner

APPARATUS AND METHOD AND SYSTEM FOR INSPECTING A COMPONENT OF A GAS TURBINE ENGINE

BACKGROUND

Embodiments of the present disclosure pertain to an apparatus and method for inspecting a component of a gas turbine engine and more specifically to an apparatus and method for inspecting an internal passage of a component a gas turbine engine.

Engine run turbine hardware may return from the field and be overhauled. Accordingly, it is desirable to provide an apparatus and method for inspecting an internal passage of a component a gas turbine engine.

BRIEF DESCRIPTION

Disclosed is a sleeve configured to surround a component of a gas turbine engine, the sleeve comprising: a pair of opposing wall members being secured to each other at at least one of a pair of opposite ends; an internal cavity located between the pair of opposing wall members, wherein the internal cavity extends from one end of the sleeve to an opposite end of the sleeve; and a plurality of orifices extending through the pair of opposing wall members.

In addition to one or more of the above disclosed features or as an alternate, at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices.

In addition to one or more of the above disclosed features or as an alternate, the internal cavity has a configuration that surrounds an exterior surface of an airfoil, and wherein the airfoil is part of a turbine blade or vane.

In addition to one or more of the above disclosed features or as an alternate, one of the pair of wall members is convex with respect to the internal cavity and the other one of the pair of wall members is concave with respect to the internal cavity.

In addition to one or more of the above disclosed features or as an alternate, each of the plurality of orifices has a circular configuration.

In addition to one or more of the above disclosed features or as an alternate, the sleeve is formed from a non-magnetic material.

In addition to one or more of the above disclosed features or as an alternate, the sleeve is a sheet of material that is continuous at the at least one of the pairs of opposite ends.

Disclosed is a system for inspecting one or more passages in a component of a gas turbine engine, the system comprising: a sleeve configured to surround a component of a gas turbine engine, the sleeve comprising: a pair of opposing wall members being secured to each other at at least one of a pair of opposite ends; an internal cavity located between the pair of opposing wall members, wherein the internal cavity extends from one end of the sleeve to an opposite end of the sleeve; a plurality of orifices extending through the pair of opposing wall members; and a probe configured to be received within the plurality of orifices, wherein each of the plurality of orifices are configured to maintain the probe perpendicularly with respect to a surface of the component when the component is received in the sleeve and the probe is received in a first orifice of the plurality of orifices.

In addition to one or more of the above disclosed features or as an alternate, at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices.

In addition to one or more of the above disclosed features or as an alternate, the internal cavity has a configuration that surrounds an exterior surface of an airfoil, and wherein the airfoil is part of a turbine blade or vane.

In addition to one or more of the above disclosed features or as an alternate, one of the pair of opposing wall members is convex with respect to the internal cavity and the other one of the pair of opposing wall members is concave with respect to the internal cavity.

In addition to one or more of the above disclosed features or as an alternate, each of the plurality of orifices has a circular configuration.

In addition to one or more of the above disclosed features or as an alternate, the sleeve is formed from a non-magnetic material.

In addition to one or more of the above disclosed features or as an alternate, the sleeve is a sheet of material that is continuous at the at least one of the pair of opposite ends.

In addition to one or more of the above disclosed features or as an alternate, the probe is a magnetometer probe.

Disclosed is a method for inspecting one or more passages of a component of a gas turbine engine, the method comprising: positioning a sleeve about the component, the sleeve including: a pair of opposing wall members being secured to each other at at least one of a pair of opposite ends; an internal cavity located between the pair of opposing wall members, wherein the internal cavity extends from one end of the sleeve to an opposite end of the sleeve; and a plurality of orifices extending through the pair of opposing wall members; and inserting a probe into one of the plurality of orifices, wherein each of the plurality of orifices are configured to maintain the probe perpendicularly with respect to an outer surface of the component when the component is received in the sleeve and the probe is received in the first orifice.

In addition to one or more of the above disclosed features or as an alternate, at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices; and the method includes: inserting the probe into each orifice in one of the pair of opposing wall members to inspect magnetic permeability through the component.

In addition to one or more of the above disclosed features or as an alternate, one of the pair of wall members is convex with respect to the internal cavity and the other one of the pair of wall members is concave with respect to the internal cavity; and the method includes: positioning the sleeve over the airfoil so each of the plurality of orifices in one of the pair of opposing wall members is located proximate a respective one of a plurality of passages in the airfoil.

In addition to one or more of the above disclosed features or as an alternate, the method includes: inspecting magnetic permeability through the airfoil by: inserting the probe into the each of the plurality of orifices in one of the pair of opposing wall members; and then inserting the probe into each of the plurality of orifices in the other of the pair of opposing wall members.

In addition to one or more of the above disclosed features or as an alternate, the method includes comparing measured magnetic permeability with a threshold value to determine a structural integrity of the component.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the FIGS.

Figure 1:
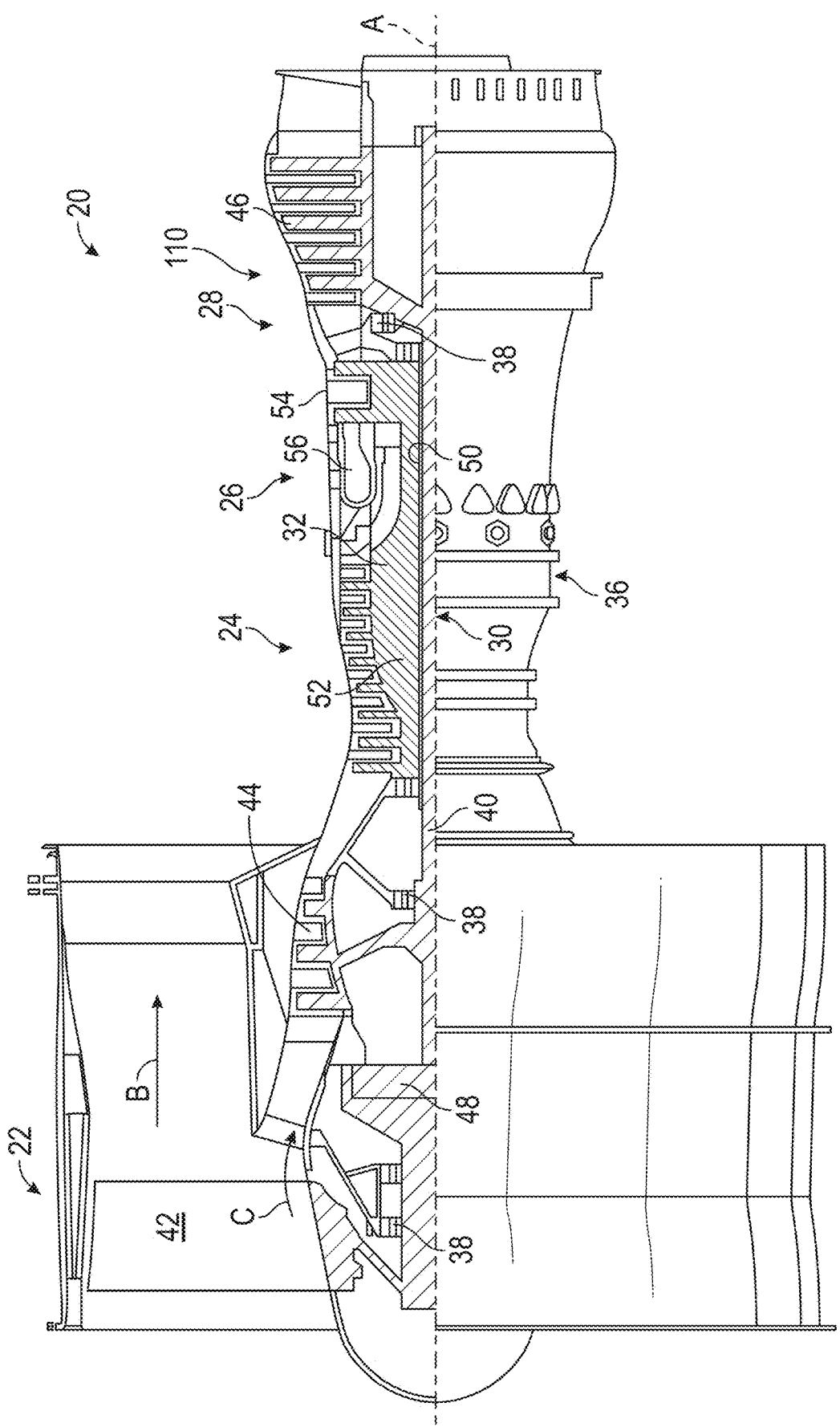
FIG. 1 is a partial cross-sectional view of a gas turbine engine.
Figure 3:
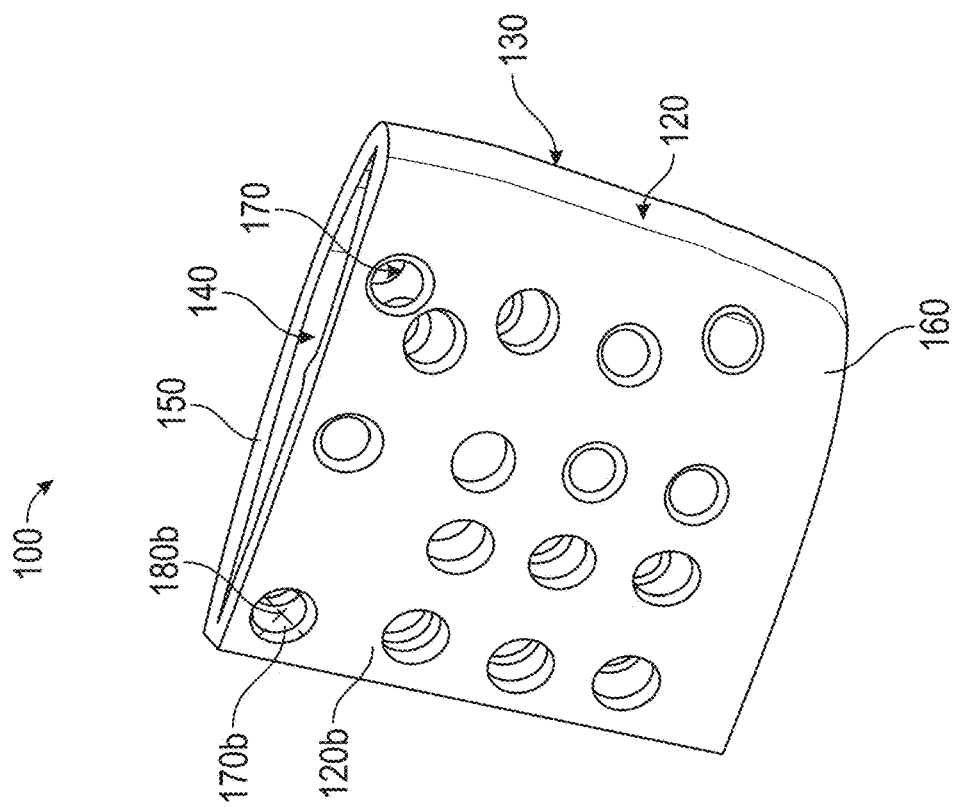
FIGS. 2 and 3 are perspective views of a sleeve in accordance with the present disclosure.
Figure 2:
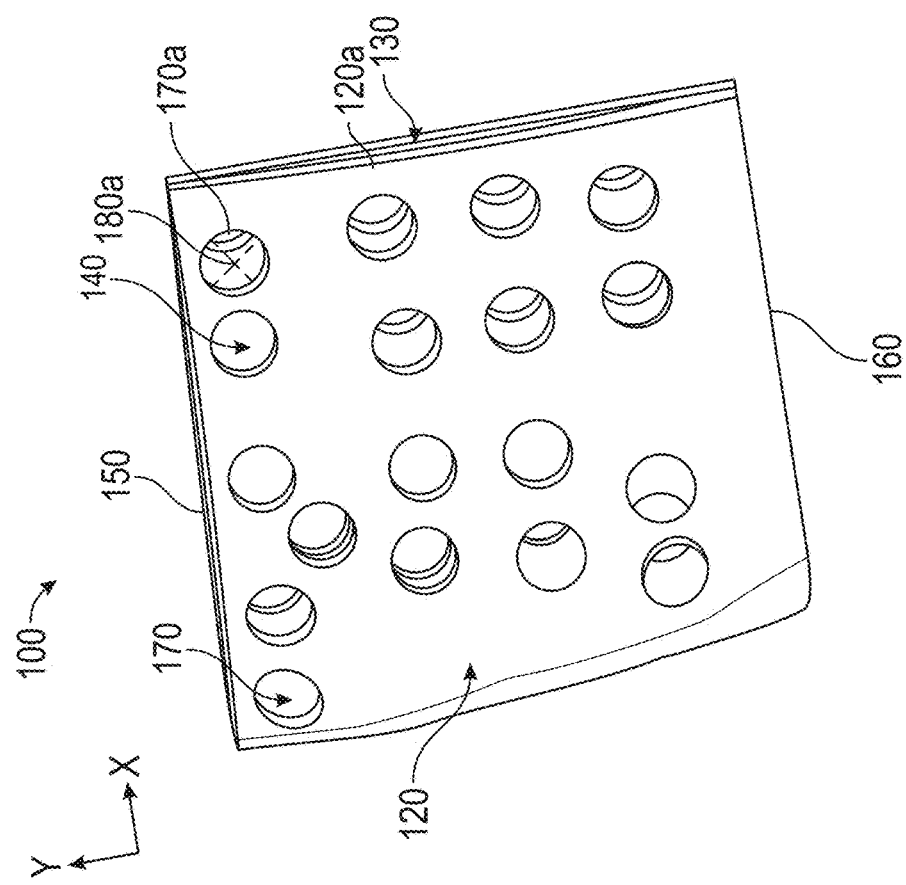

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present disclosure is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8Mach and about 35,000 feet (10,688 meters). The flight condition of 0.8 Mach and 35,000 ft. (10,688 meters), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of [(Tram ° R)/(518.7° R)]0.5. The "Low corrected fan tip speed" as disclosed herein according to one non-limiting embodiment is less than about 1150 ft/second (350.5 m/sec).

Turning to FIGS. 2-5, a sleeve 100 for inspecting a plurality of internal passages 105 of a component 110 of a gas turbine engine 20 is illustrated. The sleeve 100 is configured to surround a component 110 of the gas turbine engine 20. In one embodiment the component 110 is an airfoil, such as part of a turbine blade or vane. Configuring the sleeve 110 to surround other components 110 of the gas turbine engine 20 is considered to be within the scope of the present disclosure.

The sleeve 100 includes a pair of opposing wall members 120. The pair of opposing wall members 120 are secured to each at least one 130a of a pair of opposite ends (spaced along axis X in FIG. 2) 130. In one embodiment, the sleeve 100 is a sheet of material that is continuous at the at least one 130a of the pair of opposite ends 130. In other words, the sleeve may be a single piece of material folded upon itself. An internal cavity 140 is located between the pair of opposing wall members 120. The internal cavity 140 extends from one end 150 of the sleeve 100 to an opposite end 160 (spaced from the one end 150 along axis Y in FIG. 2) of the sleeve 100. A plurality of orifices 170 extend through the pair of opposing wall members 120.

At least one 170a of the plurality of orifices 170 is located on one 120a of the pair of opposing wall members 120. Another one 170b of the plurality of orifices 170 is located on the other one 120b of the pair of opposing wall members 120. A center 180a of the at least one 170a of the plurality of orifices 170 is axially aligned with a center 180b of the another one 170b of the plurality of orifices 170.

Figure 4:
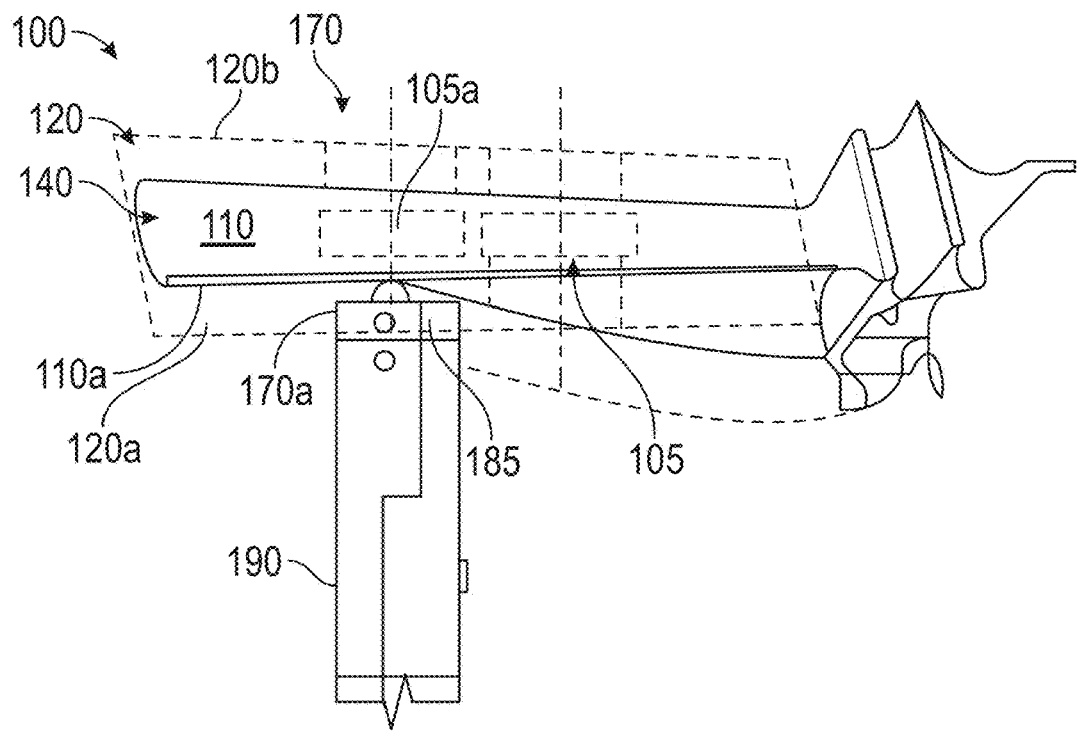
FIGS. 4 and 5 illustrate the sleeve of FIGS. 2 and 3 disposed on an airfoil.
Figure 5:
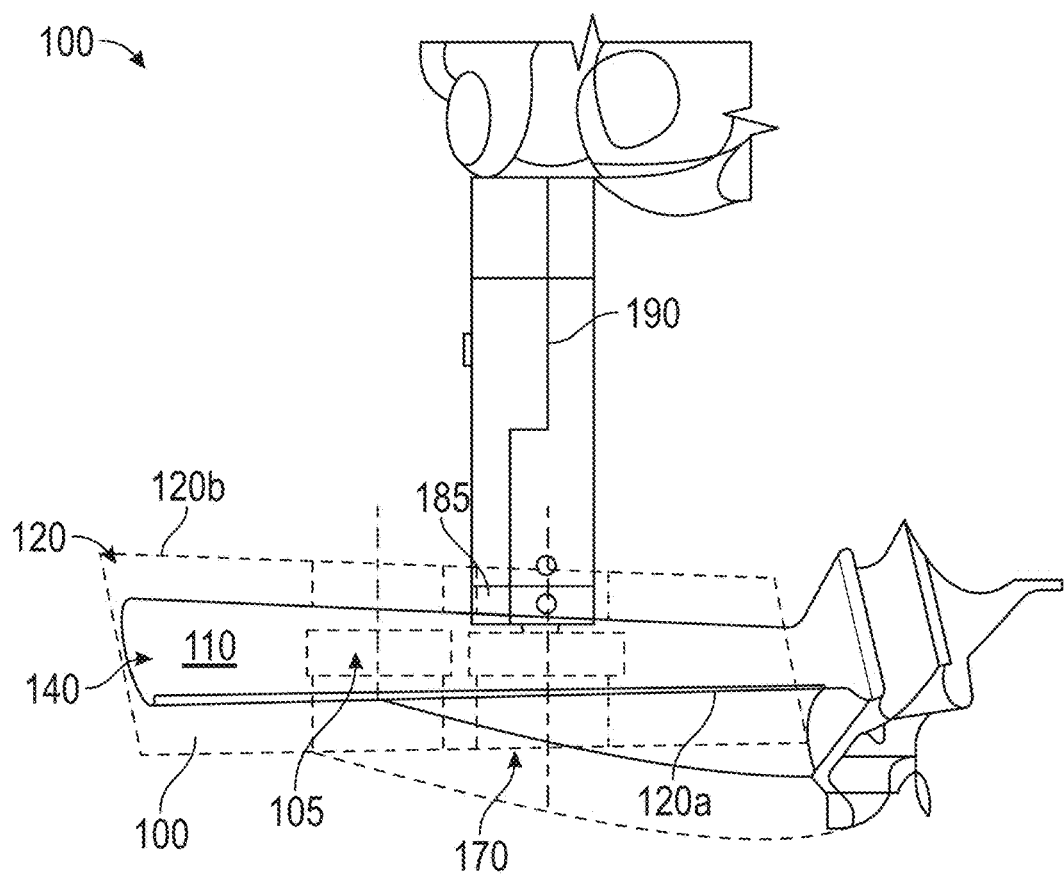

Turning to FIGS. 4 and 5 and, in one embodiment, the internal cavity 140 has a configuration that surrounds an exterior surface 110a of an airfoil 110 of a turbine blade or vane. In such embodiment, the one 120a of the pair of wall members 120 is convex with respect to the internal cavity 140, and the other one 120b of the pair of wall members 120 is concave with respect to the internal cavity 140. The sleeve 100 also is configured so that each of the plurality of orifices 170 in the one 120a of the pair of opposing wall members 120 is located proximate a respective one of the plurality of passages 105 in the airfoil 110. With this configuration, the one 170a of the plurality of orifices 170 is opposite the another one 170b of the plurality of orifices 170 and axially aligned through one passage 105a of the plurality of passages, when the component 110 is received in the sleeve 100.

A probe 185 is configured to be received within the plurality of orifices 170. Each of the plurality of orifices 170 are configured to maintain the probe 185 perpendicularly with respect to a surface 110a of the component 100 when the component 100 is received in the sleeve 100 and the probe 185 is received in anyone of the plurality of orifices 170. As illustrated and in one non-limiting embodiment, the probe 185 has a circular configuration and, accordingly, each of the plurality of orifices has a complementary circular configuration. Of course, other configurations for the probe and the matching orifice may be contemplated.

The sleeve 100 is utilized for inspecting the plurality of passages 105 in the airfoil 110. For example, the sleeve 100 is positioned about the airfoil 110 and then the probe 185, which may be a probe of a magnetometer 190, is inserted into one of the plurality of orifices 170. The probe 185, in one of the plurality of orifices 170, is aligned with another one of the plurality of orifices 170 and at least one passage of the plurality of passages 105. When magnetometer 190 is activated, magnetic permeability may be obtained through one or both of the wall members 120 surrounding one passage of the plurality of passages 105. The magnetic permeability may be compared with a threshold value to determine a structural integrity of the component 110. The sleeve 100 may be manufactured from a non-magnetic material to not interfere with the energy emitted from or read by the probe 185.

Due to the configuration of the plurality of orifices 170 in the sleeve 100, the inspection process may include inserting the probe 185 into the each of the plurality of orifices 170 in the one 120a of the pair of opposing wall members 120. During this time, probe measurements may be taken at each of the plurality of orifices 170 in the one 120a of the pair of opposing wall members 120. Then the probe 185 may be inserted into each of the plurality of orifices 170 in the other 120b of the pair of opposing wall members 120. During this time, probe measurements may be taken at each of the plurality of orifices 170 in the other 120b of the pair of opposing wall members 120. Thus, permeability measurements may be obtained at each of the plurality of passages 105 from both of the pair of opposing wall members 120. With the controlled orientation of the probe 185 within each of the plurality of orifices 170, the inspection process may be consistently repeated as desired to inspect for oxidation and corrosion in the airfoil 11.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A sleeve configured to surround a component of a gas turbine engine, the sleeve comprising:
   a pair of opposing wall members being secured to each other at at least one of a pair of opposite ends;
   an internal cavity located between the pair of opposing wall members, wherein the internal cavity extends from one end of the sleeve to an opposite end of the sleeve; and
   a plurality of orifices extending through the pair of opposing wall members.

2. The sleeve of claim 1, wherein at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices.

3. The sleeve of claim 2, wherein the internal cavity has a configuration that surrounds an exterior surface of an airfoil, and wherein the airfoil is part of a turbine blade or vane.

4. The sleeve of claim 3, wherein one of the pair of wall members is convex with respect to the internal cavity and the other one of the pair of wall members is concave with respect to the internal cavity.

5. The sleeve of claim 4, wherein each of the plurality of orifices has a circular configuration.

6. The sleeve of claim 5, wherein the sleeve is formed from a non-magnetic material.

7. The sleeve of claim 6, wherein the sleeve is a sheet of material that is continuous at the at least one of the pairs of opposite ends.

8. A system for inspecting one or more passages in a component of a gas turbine engine, the system comprising:
a sleeve configured to surround a component of a gas turbine engine, the sleeve comprising:
a pair of opposing wall members being secured to each other at at least one of a pair of opposite ends;
an internal cavity located between the pair of opposing wall members, wherein the internal cavity extends from one end of the sleeve to an opposite end of the sleeve;
a plurality of orifices extending through the pair of opposing wall members; and
a probe configured to be received within the plurality of orifices, wherein each of the plurality of orifices are configured to maintain the probe perpendicularly with respect to a surface of the component when the component is received in the sleeve and the probe is received in a first orifice of the plurality of orifices.

9. The system of claim 8, wherein at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices.

10. The system of claim 9, wherein the internal cavity has a configuration that surrounds an exterior surface of an airfoil, and wherein the airfoil is part of a turbine blade or vane.

11. The system of claim 10, wherein one of the pair of opposing wall members is convex with respect to the internal cavity and the other one of the pair of opposing wall members is concave with respect to the internal cavity.

12. The system of claim 11, wherein each of the plurality of orifices has a circular configuration.

13. The system of claim 12, wherein the sleeve is formed from a non-magnetic material.

14. The system of claim 13, wherein the sleeve is a sheet of material that is continuous at the at least one of the pair of opposite ends.

15. The system of claim 14, wherein the probe is a magnetometer probe.

16. A method for inspecting one or more passages of a component of a gas turbine engine, the method comprising:
positioning a sleeve about the component, the sleeve including: a pair of opposing wall members being secured to each other at at least one of a pair of opposite ends; an internal cavity located between the pair of opposing wall members, wherein the internal cavity extends from one end of the sleeve to an opposite end of the sleeve; and a plurality of orifices extending through the pair of opposing wall members; and
inserting a probe into one of the plurality of orifices, wherein each of the plurality of orifices are configured to maintain the probe perpendicularly with respect to an outer surface of the component when the component is received in the sleeve and the probe is received in the first orifice.

17. The method of claim 16, wherein at least one of the plurality of orifices is located on one of the pair of opposing wall members and another one of the plurality of orifices is located on the other one of the pair of opposing wall members, wherein a center of the at least one of the plurality of orifices is axially aligned with a center of the another one of the plurality of orifices; and
the method includes:
inserting the probe into each orifice in one of the pair of opposing wall members to inspect magnetic permeability through the component.

18. The method of claim 17, wherein one of the pair of wall members is convex with respect to the internal cavity and the other one of the pair of wall members is concave with respect to the internal cavity; and
the method includes:
positioning the sleeve over the airfoil so each of the plurality of orifices in one of the pair of opposing wall members is located proximate a respective one of a plurality of passages in the airfoil.

19. The method of claim 18, comprising:
inspecting magnetic permeability through the airfoil by:
inserting the probe into the each of the plurality of orifices in one of the pair of opposing wall members; and
then inserting the probe into each of the plurality of orifices in the other of the pair of opposing wall members.

20. The method of claim 19, comprising comparing measured magnetic permeability with a threshold value to determine a structural integrity of the component.

* * * * *